US012607667B2

(12) United States Patent
Pulikottil et al.

(10) Patent No.: US 12,607,667 B2
(45) Date of Patent: Apr. 21, 2026

(54) SYSTEM AND METHOD FOR DETECTION OF ANOMALIES IN TEST AND MEASUREMENT RESULTS OF A DEVICE UNDER TEST (DUT)

(71) Applicant: Tektronix, Inc., Beaverton, OR (US)

(72) Inventors: Siby Charley Pulikottil, Bengaluru (IN); Sriram Mandyam Krishnakumar, Bengaluru (IN); Mahesha Guttahalli Lakshmipathy, Bengaluru (IN)

(73) Assignee: Tektronix, Inc., Beaverton, OR (US)

( * ) Notice: Subject to any disclaimer, the term of this patent is extended or adjusted under 35 U.S.C. 154(b) by 664 days.

(21) Appl. No.: 17/949,158

(22) Filed: Sep. 20, 2022

(65) Prior Publication Data

US 2023/0086626 A1 Mar. 23, 2023

(30) Foreign Application Priority Data

Sep. 23, 2021 (IN) .............................. 202121043152

(51) Int. Cl.
G01R 31/28 (2006.01)

(52) U.S. Cl.
CPC ................................ G01R 31/2834 (2013.01)

(58) Field of Classification Search
CPC ........................ G01R 31/2834; G01R 31/2846
See application file for complete search history.

(56) References Cited

U.S. PATENT DOCUMENTS

| | | | | |
|---|---|---|---|---|
| 2006/0041803 A1* | 2/2006 | Woodward | .............. | G06F 11/24 |
| | | | | 714/E11.154 |
| 2006/0267577 A1* | 11/2006 | Erez | ................. | G11C 29/56008 |
| | | | | 324/759.03 |
| 2007/0038433 A1* | 2/2007 | Swoboda | ........... | G06F 11/3656 |
| | | | | 703/23 |

(Continued)

*Primary Examiner* — Huy Q Phan
*Assistant Examiner* — Haidong Zhang
(74) *Attorney, Agent, or Firm* — Miller Nash LLP; Andrew J. Harrington

(57) ABSTRACT

A test and measurement device has an interface, one or more connectors, each connector to allow the test and measurement device to connect to a test and measurement instrument, and one or more processors configured to execute code to cause the one or more processors to: receive one or more user inputs through the interface identifying one or more tests to perform on a device under test (DUT); form a connection through one of the one or more connectors to the DUT to perform the one or more tests and receive test result data; apply one or more machine learning models to the test result data to identify potentially anomalous test results; and generate and present a representation of the test result data and the potentially anomalous test results. A method of analyzing test data includes receiving one or more user inputs through an interface identifying one or more test to perform on a device under test (DUT), forming a connection to at least one test and measurement instrument, directing the test and measurement instrument to perform one or more tests on the DUT and receive test result data, applying one or more machine learning models to the test result data to identify potentially anomalous test results, and generating and presenting a representation of the test result data and the potentially anomalous test results.

16 Claims, 6 Drawing Sheets

(56)  References Cited

U.S. PATENT DOCUMENTS

| | | | |
|---|---|---|---|
| 2008/0262793 A1* | 10/2008 | Subramaniam .... | G01R 31/2894 |
| | | | 702/179 |
| 2018/0074096 A1* | 3/2018 | Absher ................. | G01R 23/16 |

* cited by examiner

SYSTEM AND METHOD FOR DETECTION OF ANOMALIES IN TEST AND MEASUREMENT RESULTS OF A DEVICE UNDER TEST (DUT)

CROSS-REFERENCE TO RELATED APPLICATIONS

This disclosure claims benefit of Indian Provisional Application No. 202121043152, titled "SYSTEM AND METHOD FOR DETECTION OF ANOMALIES IN TEST AND MEASUREMENT RESULTS OF A DEVICE UNDER TEST (DUT)," filed on Sep. 23, 2021, the disclosure of which is incorporated herein by reference in its entirety.

TECHNICAL FIELD

The present disclosure relates generally to testing of electronic devices and specifically to monitoring and analysis of electronic device testing data.

BACKGROUND

Flawless hardware designs of electronic components such as semiconductor chips often need multiple steps. One of the critical steps in the hardware design cycle involves robust validation, system, and verification test. The validation test cycle uncovers potential anomalies critical for the release of the semiconductor chip.

FIG. 1 illustrates a typical semiconductor chip development cycle. These include a verification process that includes specification development and Resistor Transistor Logic (RTL) design, a validation step that includes stress testing and characterization, and a production step that includes manufacturing testing. The chip development cycle for System on a Chip (SoC) includes a SoC verification test, a SoC validation test, and a SoC production test. Further, the validation and compliance test cycle includes performance of a system test, a stress test, a characterization test and a compliance test.

In the validation step, the characterization process involves testing the design with voltage and frequency shmooing to find the ideal operating conditions. Designs with high-speed inputs and outputs (like PCIE, Ethernet, DDR, etc.) also go through characterization of IO ports by shmooing various electrical parameters to arrive at ideal transmission and error rates. This test involves large test cases and consumes significant amount of the user's time. The post-analysis time consumed requires users to analyze the large datasets collected as part of the test, making the delay significant and increases the costs.

While executing compliance or characterization tests for any Device Under Test (DUT) belonging to any given technology, test automation software generally reports a set of measurements. Each of these measurements could be compared against their specific limit values for obtaining individual measurement quality and all measurement results once the execution is completed and later analyzed for gathering specific insights. This analysis takes up a lot of time and resources, increasing the costs mentioned in the above discussion.

By considering all measurement results instead of looking at individual results and drawing siloed conclusion, the process can determine the DUT quality. In addition, with the above operation happening in an integrated real time, it can significantly reduce the users/expert's effort in debugging the problem.

Some problem solutions that achieve maximum automation of analysis of test and measurement using Machine Learning (ML) and Artificial Intelligence (AI). However, Test and Measurement (TNM) as a domain remains largely untouched with the latest developments and capabilities of ML probably due to the characteristics of the data and/or problems associated with TNM.

Therefore, a need exists for effective, automatic testing system and method based on ML/AI that provides smart data analysis of the test data and a feedback near to real-time during the test execution. This can significantly reduce the users/expert's effort in debugging the problem, speed up the process, and make the process more efficient.

BRIEF DESCRIPTION OF ACCOMPANYING DRAWINGS

DETAILED DESCRIPTION

Figure 1:
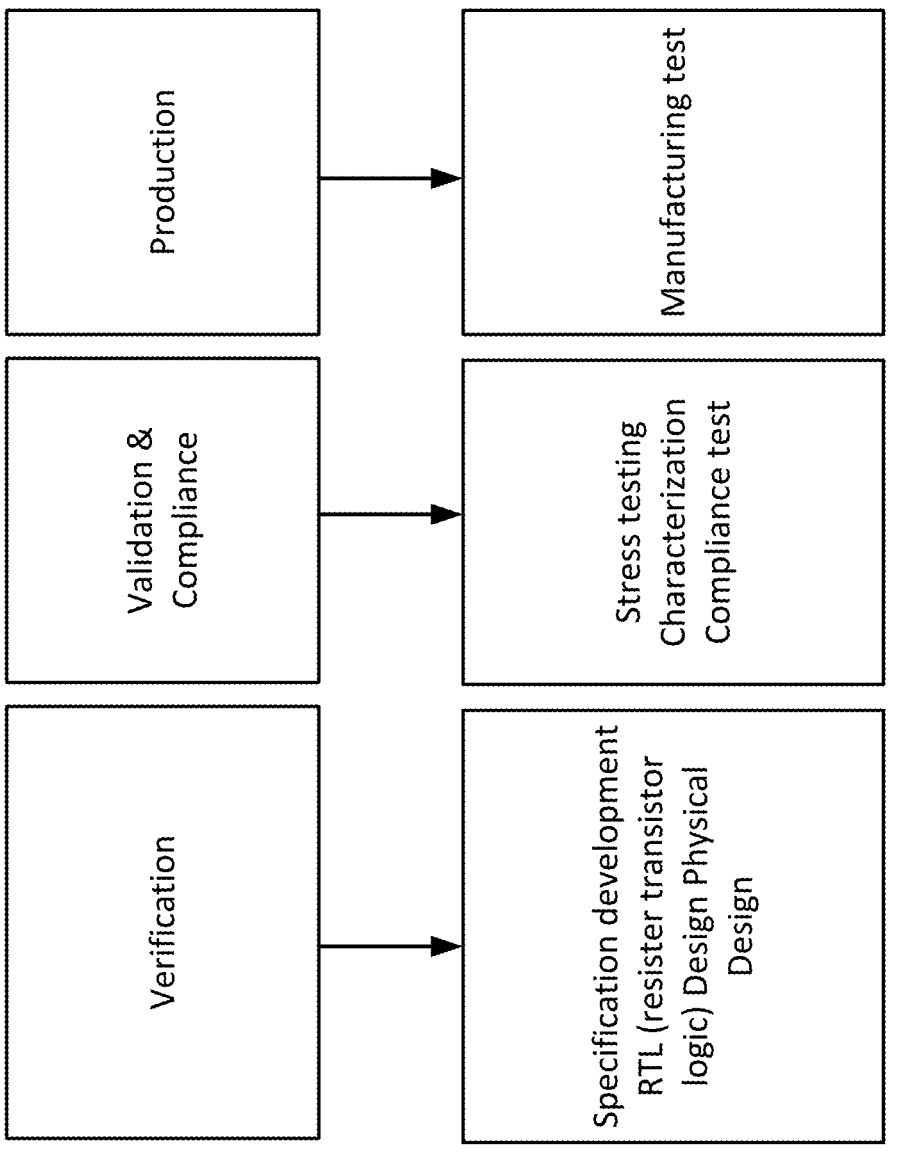
FIG. 1 shows a conventional semiconductor chip development cycle in accordance with the prior art.

The various embodiments of the present disclosure provide a machine learning—artificial intelligence (ML/AI) based system and method for detection of anomalies in test and measurement results of a DUT. The present disclosure provides a ML/AI method and system for detection of anomalies in test and measurement results of a DUT in real time by taking into consideration consolidated reported measurements with the test.

The discussion here uses the terms artificial intelligence (AI) and machine learning (ML) mostly interchangeable. Machine learning generally makes up subset of AI. ML involves a model-based system in which the model may undergo training, often referred to as supervised learning, to "teach" the model how to recognize patterns and make predictions based upon data received. Unsupervised model-based systems do not typically have a training process. For example, the conditions surrounding a particular data set gathered during operation determines how the model determines its predictions. This discussion may refer to the machine learning module as a machine learning network, as it will generally take the form of a deep learning network, where the term "network" refers to a network of "nodes" or "neurons" in the machine learning module.

In the following description, for purpose of explanation, specific details are set forth to provide an understanding of the present disclosure. It will be apparent, however, to one skilled in the art that the present disclosure may be practiced without these details. One skilled in the art will recognize that embodiments of the present disclosure, some of which are described below, may be incorporated into several systems. However, the systems and methods are not limited to the specific embodiments described herein. Further, structures and devices shown in the figures are illustrative of exemplary embodiments of the present disclosure and are meant to avoid obscuring of the present disclosure.

Furthermore, connections between components and/or modules within the figures are not intended to be limited to direct connections. Rather, these components and modules may be modified, re-formatted or otherwise changed by intermediary components and modules. References in the present disclosure to "embodiment" mean that a particular feature, structure, characteristic, or function described in connection with the embodiment is included in at least one embodiment of the disclosure. The appearances of the phrase "in an embodiment" in various places in the specification are not necessarily all referring to the same embodiment.

Generally, the system platform will reside on a test and measurement computing device that may connect to multiple test and measurement instruments as the various testing needs arise. As technology continues to evolve and more computing power can fit into smaller and less expensive packages, the embodiments may encompass a single device or housing that contains all of the necessary hardware and components to act as both the test and measurement computing device and the test and measurement instrument connected directly to the DUT. No limitation to any particular architecture is intended and none should be implied.

Figure 2:
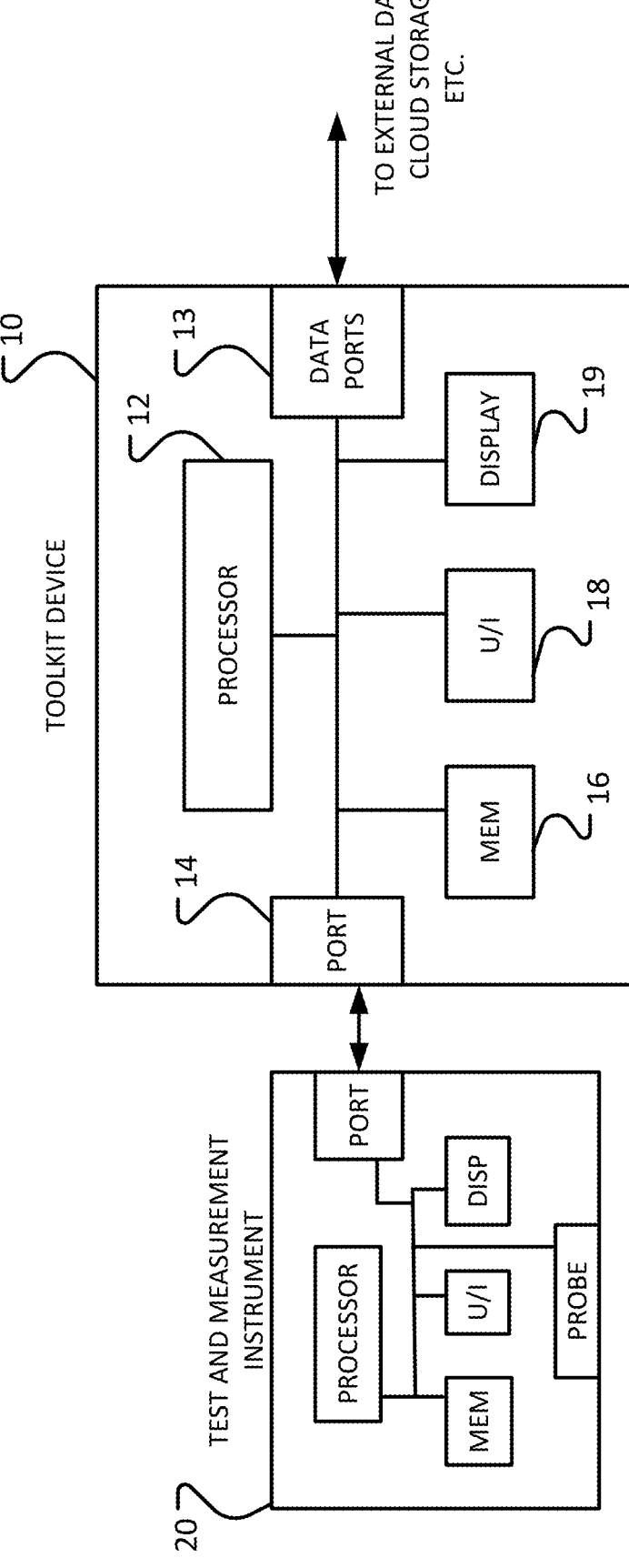
FIG. 2 shows an embodiment of a test and measurement system.

The embodiment of FIG. 2 shows the two devices as separate devices, with the understanding that elements of each may be combined and all of the functionality and capability may reside in one device. The test and measurement device 10 may comprise a computer, server or other computing device. The toolkit device 10 may include one or more processors 12 that communicate with a test and measurement instrument 20 through a port 14. This port may comprise a wireless or wired/cabled port combined with drivers for multiple test and measurement instruments that allow the toolkit device to set up and run test on a device under test (DUT), including connecting directly to the DUT. The port 14 may include ports to communicate with other devices, remote storage, etc. Alternatively, another data port 13 may provide that access.

The toolkit device will also include one or more data repositories, represented by the memory 16. The user interacts with the test and measurement device through a user interface 18 and a display 19. This allows the users to make selections for tests and display representations of the data analysis, such as by visualizations performed by the machine learning system or data readouts through the API. The test and measurement instrument 20 has similar components to the toolkit device, which may combination of the two devices in some embodiments, as mentioned previously.

The one or more processors 12 may be configured to execute code that causes the processors to implement the methods and system of the embodiments. The devices may distribute the processing tasks across both devices.

Figure 3:
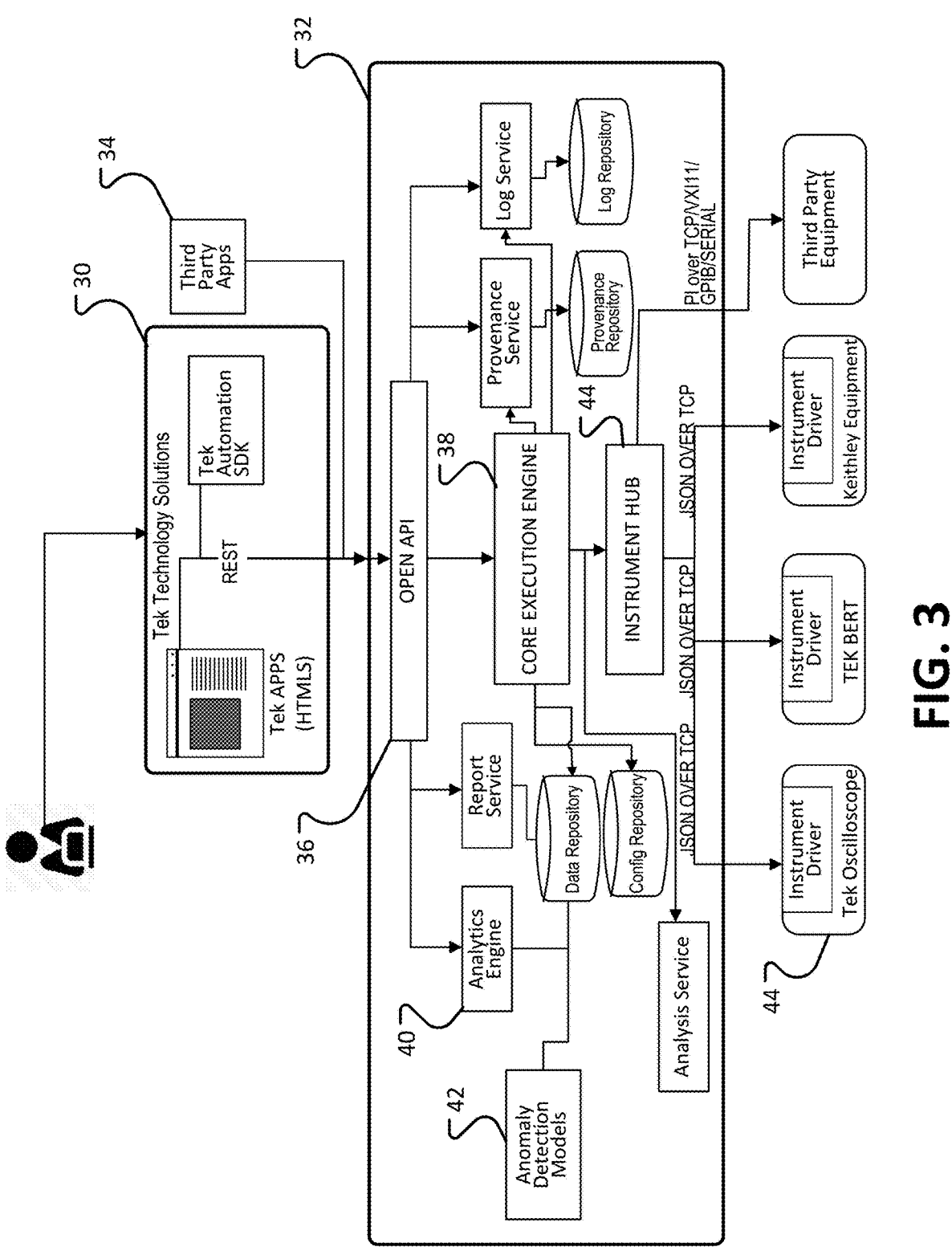
FIG. 3 shows an architecture of a system for detection of anomalies in test and measurement results of a Device Under Test (DUT) in a validation setup.

FIG. 3 shows an embodiment of a system architecture for detection of anomalies in test and measurement results of a DUT. The system will typically take the form of a tool, hereinafter referred to as "smart data analysis tool" or toolkit. The architecture shown in FIG. 3 depicts the integration of the smart data analysis tool in a validation setup involving the test and measurement results. As discussed above, this may reside on a computing device separate from a test and measurement instrument, or integrated into the instrument.

The smart data analysis tool comprises of an interface and an automation unit to perform one or more tests on a DUT. The interface enables a user to provide the required inputs and specify the test requirements. In one embodiment, the interface contains a Tektronix® app, Tek automation Software Development Kit (SDK) 30. The interface interacts with the automation unit 32 via an Open Application Program Interface (Open API) 36 using one or more REST API calls. A REST API is an API that complies with REepresentational State Transfer (REST) architectural style, used to provide standards between computer systems on the web, making it easier for them to communicate. The user can retrieve the anomalies through a user interface such as an application 30 as mentioned above, or just through the Open API 36. The discussion here groups these together using the term "interface."

One or more third party applications 34 also interact with the automation unit 32 via the Open API. The automation unit contains one or more modules to perform the tests specified by the user, record test data and perform analysis of the test data. In one embodiment, the automation unit comprises of a Core Execution Engine 38, an analytics engine 40, several services and repositories, and an Anomaly detection model module 42. The analytics engine performs various analyses on the test results data received from the DUT including various measurements and comparison. The Anomaly detection module 42 will comprise a machine learning network to apply machine learning to the data to provide the predicted outliers analysis previously mentioned.

The various services include a report service, a provenance service, a log service, and an analysis service. As used here, the term "service" means software that performs automated tasks, responds to hardware events and requests from other software modules within the automation unit. In the embodiments here, these services include a report service, an analysis service, a provenance service, and a log service. The term "provenance" refers to information about the data including the test results data and generally can be considered a form of metadata.

The Core Execution Engine 38 also has connections to various repositories that may also relate to the services discussed above. These includes the configuration repository that stores test configurations. The data repository generally stores the test results data gathered from the test and measurement instrument. The provenance repository stores the provenance information about the data and the log repository stores the operation logs that may provide information about issues in the system operation. These repositories may reside in one memory as demonstrated in FIG. 2, such as partitions of a much larger memory, or may represent separate memory devices for each repository.

The Anomaly detection model module is connected to the data repository for performing analysis of the test data stored in the data repository. The Analytics engine performs "standard" analyses on analysis on the test results data, in contrast with the Anomaly detection module, which uses the machine learning network to perform analysis of the data and provide the predictions of what data results are outliers.

The Core Execution Engine is further connected to an Instrument hub, which is connected to one or more instruments such as an oscilloscope 44. In one embodiment, the instruments that are connected to the Instrument hub may include an oscilloscope, a bit error rate tester (BERT), and other testing instruments manufactured by Tektronix, Keithley or other manufacturers. Each of these instruments communicate with the Instrument hub using some sort of communication protocol. In one embodiment, the protocol is JavaScript Object Notation (JSON) commands over one or more TCP communication links or through a Program Instruction over a TCP, VXL11, GPIB and/or a serial communication link. The discussion here refers to the means of communicating and/or operating the instruments as "connectors." These may take the form of a driver that communicates across a wireless or wired/cabled connection with the test and measurement instrument, or they may comprise internal software code that causes the device to perform the tests, if integrated into the test and measurement device.

A typical test/analysis operation proceeds below with respect to the validation setup of FIG. 3. A user desiring to perform smart data analysis for a Device Under Test (DUT) in a validation setup, turns ON the smart data analysis functionality of the tool. The user usually accomplished this by making selections on the user interface of the test and measurement device. The user then executes the tests scheduled in the testing process. Execution of the tests will involve the test and measurement device connecting to the test and measurement instrument or instruments connected to the DUT. As mentioned previously, this may involve the test and measurement device connecting to a separate test and measurement instrument or initializing itself to start the test, if the toolkit is integrated into the instrument. When the test and measurement device obtains new results every newly acquired waveform, the result undergoes smart data analysis that identifies the potential anomalies/outliers relative to its immediate neighbors. In one embodiment of the present disclosure, the user can specify a required level of intensity for classifying anomaly/outliers of the test results, using anomaly detection models.

Figure 4:
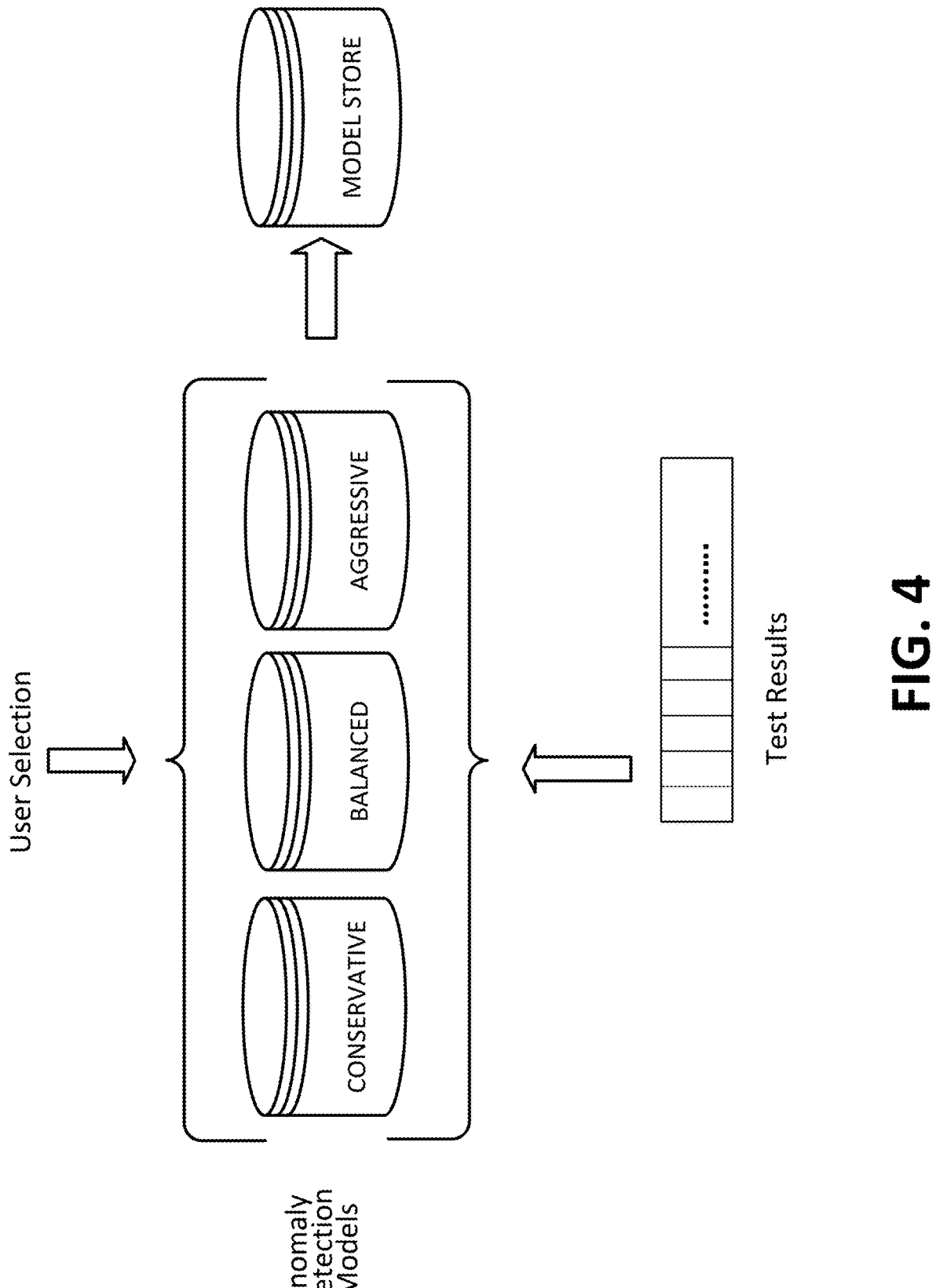
FIG. 4 shows an embodiment of an ML/AI based data analysis operation based on a level of intensity for detection of anomaly/outliers of test and measurement results.
Figure 5:
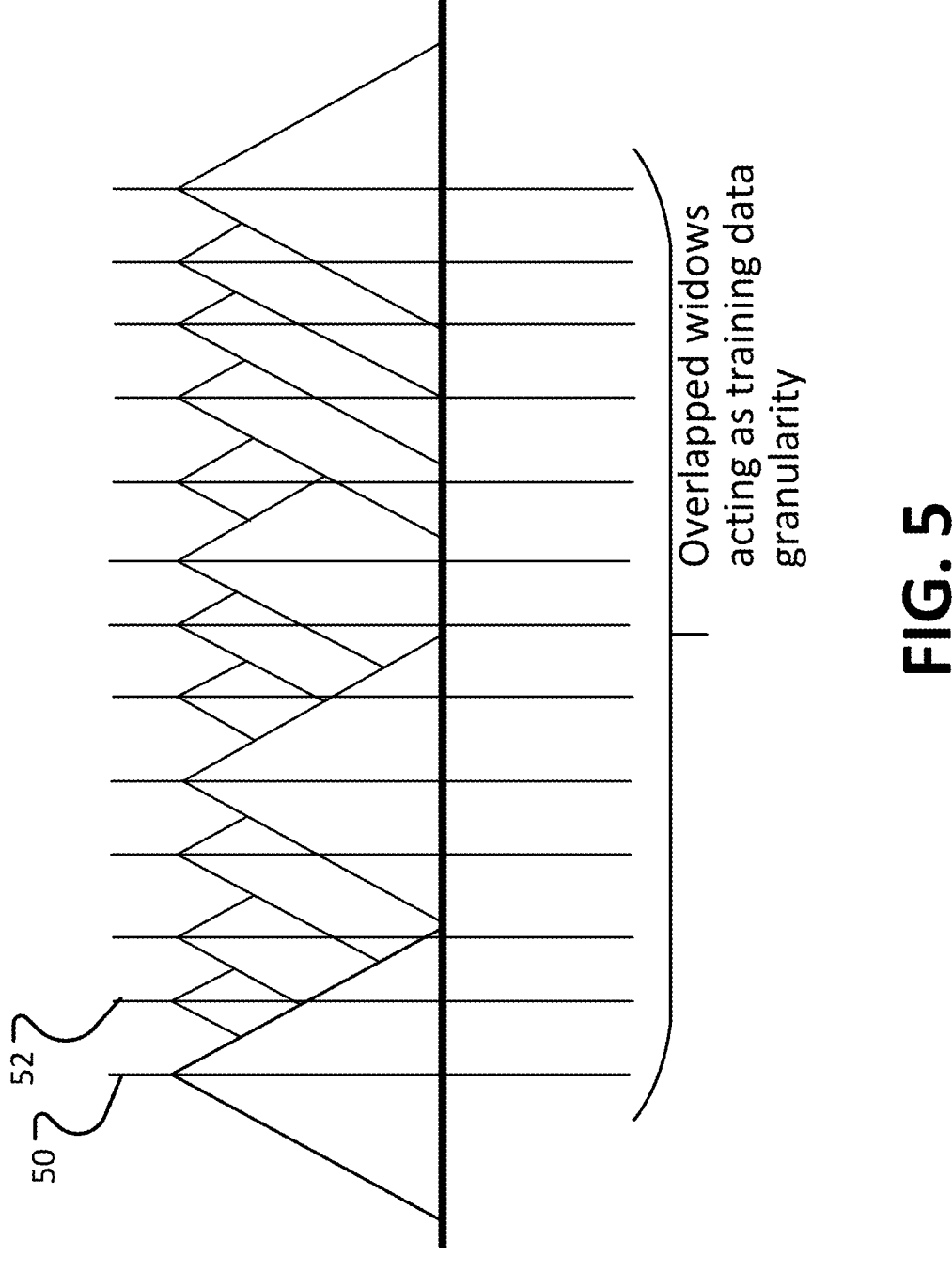
FIG. 5 shows a representation of moving window of data sets for online training and prediction for identifying outliers.

FIG. 4 shows a data analysis operation/method based on a level of intensity for the detection of anomaly/outliers of the test results. The analysis uses anomaly detection models. The intensity levels become a variable that affects the analysis method to detect one or more outliers from the test results. As shown in FIG. 4, the current embodiments use three levels of intensity, but could use many more or fewer levels.

In an example to aid with understanding of the levels, the DUT has a required range of a measurement it has to pass. A first level comprises the "conservative" level in which the device considers outliers as rare incidents. Accordingly, the conservative model categorizes a point as outlier only if there is a very strong indication. In a "balanced" model, the model categorizes a point as anomalous provided there is sufficient strength of such an indication. In the "aggressive" model, data is classified as extremely eager to categorize any point as anomalous with the slightest of indication. The user may influence the indications based upon ranges of measurements t given to the system that may cause some points to be a likely outlier. For example, using a jitter measurement as an example, the range could be 10-50 dB based upon a particular design specification. This would result in a conservative result in identifying only those points laying outside or near those limits as outliers. Tightening the range, for example to 15-20 dB, or other levels may influence how the model operates to identify outliers. The selected model may be stored in the Model Store.

In order to monitor and flag the potential anomalies with DUT test results in a consolidated manner, one embodiment combines all the available measurements. The set of measurements associated with a given test serves as indicators towards the overall quality of the DUT and its combination is imperative for the subsequent modelling. The measurement combination may take the form of a normalized vectorization procedure with dimension of the resultant vector being the total number of measurements available for that test as an N-dimensional vector, where N is the number of measurements. The number of data points may also influence the findings of data points being outliers, as the more data the models have to operate upon, the more the outliers will be noticeable against the rest of the data.

In one embodiment, all the test results are stored in the data repository. Then, based on the level of intensity specified by the user for anomaly/outlier classification, the machine learning network classifies the stored data from the repository using the anomaly detection model into conservative, balanced and aggressive models based upon the user's input in the test set up.

In addition to running the machine learning network, the machine learning network will typically undergo training. In training the ML network receives data sets and the "answers" that allow the network to connect the input data to the resulting outputs. After training, the network will have gained the ability to analyze the inputs to provide a prediction as to the nature of the output. In the machine learning here, it will predict whether a given data point comprises an outlier or not.

FIG. 4 illustrates a detailed representation of moving window based online training and prediction for identifying outliers. The identification of outliers is always relative to the immediate neighbors of test results just before the test of interest. It is important to perform identification of local outliers rather than globally because very often a sudden change in the behavior could become a norm in the longer run. The training data sets identify the local outliers using a window approach. The window approach uses a pre-defined window length of previous executed test results used for training. The data contained between lines 50 and 52 each make up one window, and those windows overlap. The approach enables adapting quickly to the changes on the input at the same time hard limits on the amount of data for training, thereby giving fine-grained control for training performance. In one embodiment, the window moves with a predefined resolution, typically one (1), meaning that the window represents one data point In order to facilitate the online learning, the system needs to store the incrementally updated models and retrieve them back at instant. Similarly, the collected data also needs to be backed up for a future use cases as a best practice. The device satisfies these requirements by regular synchronization of the learned model into a data repository and current model stored in the model/configuration store where the archived model is saved along with certain meta data. The vectorized test results used for training are also saved into the data repository as an inherent and silent dataset creation. The models undergo initial training, referred to here as pre-training using pre-trained data sets, and then incremental training during model deployment as the system gathers more data for data sets. This increases the accuracy of the models and trains them to cover new anomalies not in the pre-trained data sets In one embodiment, an automation platform incorporating the smart data analysis tool was enabled for validation of PCIE Gen2/3/4 signal test execution workflow. For every preset execution of signal test, an N-dimensional vector of measurement results was generated, and this was used as inputs towards the Anomaly detection models. One should note that an experiment involved PCIE for testing, but this solution applies to all technologies.

Figure 6:
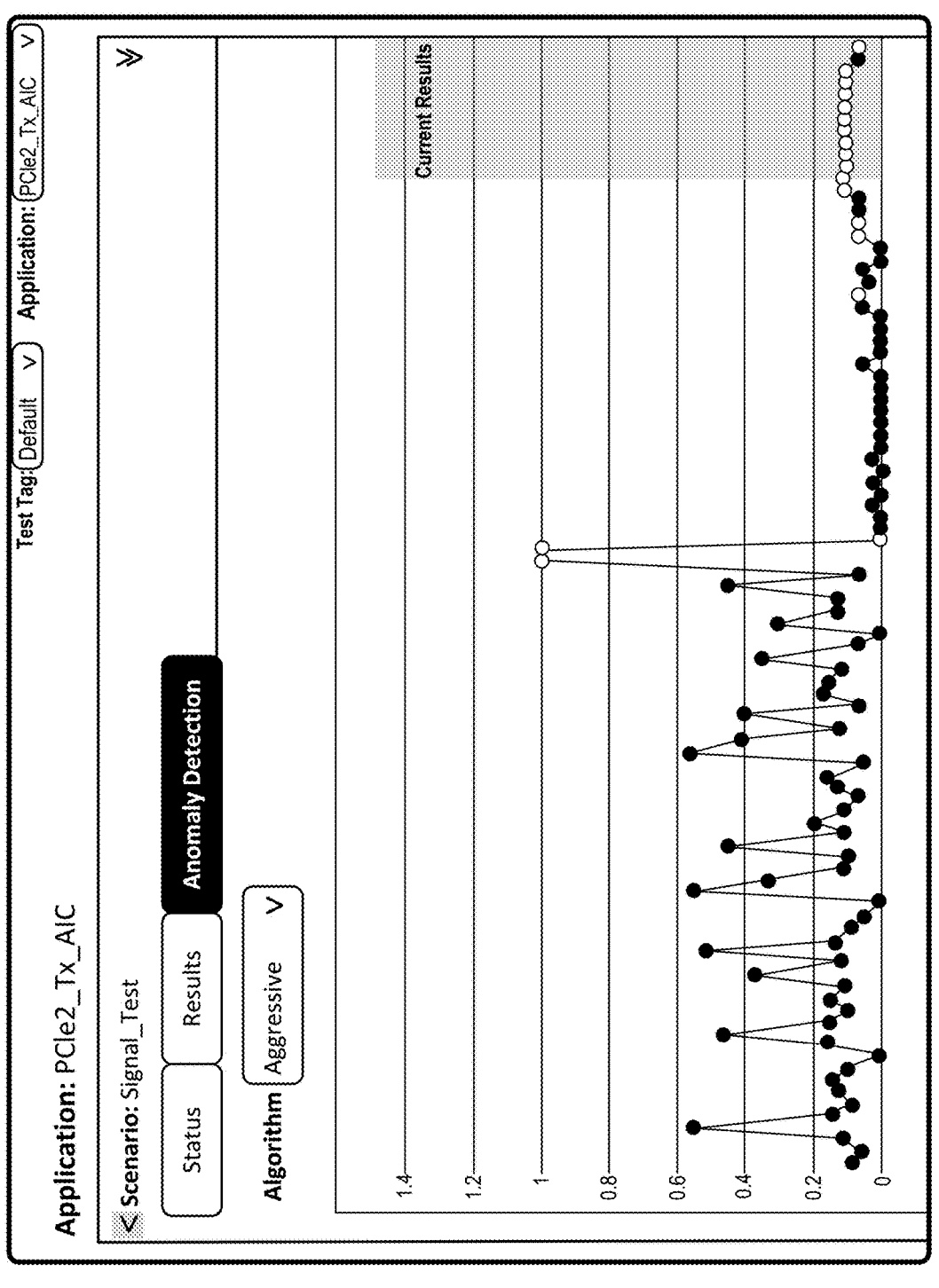
FIG. 6 shows a graph indicating the normal and anomalous behavior while performing PCIE Gen2/3/4 signal test execution.

FIG. 6 illustrates a graph indicating the normal and anomalous behavior while performing the PCIE Gen2/3/4 signal test execution. Every data point of signal test result is given an anomaly score with higher score being termed as outliers. The current prediction along with the previous prediction are visualized as a trend with solid dots for normal behavior and hollow dots with potential 1% of anomalous behavior. The test results data, meaning the anomalies, of the process may comprise a graph as shown in FIG. 6, or may be a data readout highlighting the anomalies. These are referred to here as representations of the test result data.

The embodiments of a ML-based system and method for automated test result analysis for detection of anomalies in test and measurement results of a DUT enable receiving better insights towards potential anomalous behavior of the DUT. The method and system look at the DUT quality by taking all measurement results as indicator rather being specifically associated with one result. The embodiments include a feedback and course correction with near real-time latency for DUT design. Furthermore, the test and measurement device also provides the advantages of integrated inherent insights, near real-time feedback and course correction, shorter turnaround time of the analysis cycle, and better-quality expectation of the DUT.

Estimating actual time saved in the deployment of such a device becomes difficult until widespread use. However, typical validation analysis turnaround times have reached up to 20 days. The use of this system should reduce that time to a matter of one or two days.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description refers to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Examples

Illustrative examples of the disclosed technologies are provided below. An embodiment of the technologies may include one or more, and any combination of, the examples described below.

Example 1 is a test and measurement device, comprising: an interface; one or more connectors, each connector to allow the test and measurement device to connect to a test and measurement instrument; and one or more processors, the one or more processors configured to execute code to cause the one or more processors to: receive one or more user inputs through the interface identifying one or more tests to perform on a device under test (DUT); form a connection through one of the one or more connectors to the DUT to perform the one or more tests and receive test result data; apply one or more machine learning models to the test result data to identify potentially anomalous test results; and generate and present a representation of the test result data and the potentially anomalous test results.

Example 2 is the test and measurement device of Example 1, further comprising one or more repositories to store information related to at least one of the test result data, machine learning model configurations, metadata, and system logs.

Example 3 is the test and measurement device of either of Examples 1 or 2, wherein the one or more processors reside on a computing device separate from the test and measurement instrument.

Example 4 is the test and measurement device of any of Examples 1 through 3, wherein the test and measurement device and the test and measurement instrument are the same device.

Example 5 is the test and measurement device of any of Examples 1 through 4, wherein the connectors comprise instrument drivers for one or more test and measurement instruments.

Example 6 is the test and measurement device of Example 1, wherein the code that causes the one or more processors to apply one or more machine learning models comprises code that causes the one or more processors to: generate an N-dimensional vector of the test result data for every test performed; and assign an anomaly score to each data point in the test result data.

Example 7 is the test and measurement device of any of Examples 1 through 6, wherein the code the causes the one or more processors to receive the one or more user inputs comprises code that causes the one or more processors to receive an intensity level.

Example 8 is the test and measurement device of Example 7, wherein the code that cause the one or more processors to apply one or more machine learning models to the test result data to identify potentially anomalous test results causes the one or more processors to identify outliers depending upon the intensity level.

Example 9 is the test and measurement device of any of Examples 1 through 8, wherein the one or more processors are further configured to execute code that causes the one or more processors to train the one or more machine learning models.

Example 10 is the test and measurement device of Example 9, wherein the code that causes the one or more processors to train the one or more machine learning models uses multiple windows of a pre-defined window length of previous executed test results.

Example 11 is the test and measurement device of Example 9, wherein t the code that causes the one or more processors to train the one or more machine learning models causes the one or more processors to pre-train the models before deployment and to perform training during deployment.

Example 12 is a method of analyzing test data, comprising: receiving one or more user inputs through an interface identifying one or more test to perform on a device under test (DUT); forming a connection to at least one test and measurement instrument; directing the test and measurement instrument to perform one or more tests on the DUT and receive test result data; applying one or more machine learning models to the test result data to identify potentially anomalous test results; and generating and presenting a representation of the test result data and the potentially anomalous test results.

Example 13 is the method of Example 12, further comprising storing information related to at least one of the test result data, machine learning model configurations, metadata, and system logs.

Example 14 is the method of either of Examples 12 or 13, wherein forming a connection to at least one test and measurement instrument comprises connecting to an external test and measurement instrument using a driver for the external test and measurement instrument.

Example 15 is the method of any of Examples 12 through 14, wherein generating and presenting a representation comprises one of presenting a graph on a user interface, or presenting a data readout showing anomalous test results.

Example 16 is the method of any of Examples 12 through 15, wherein applying one or more machine learning models comprises: generating an N-dimensional vector of the test result data for every test performed; and assigning an anomaly score to each data point in the test result data.

Example 17 is the method of any of Examples 12 through 16, wherein receiving one more user inputs comprises receiving an intensity level.

Example 18 is the method of Example 17, wherein applying one or machine learning models to identify anomalous test comprises identifying outliers depending upon the intensity level.

Example 19 is the Method of any of Examples 11 Through 18, Further Comprising Training the One or More Machine Learning Models Using Pre-Trained Data Sets Prior to Model Deployment, and Data Sets Developed During Deployment of the Models Example 20 is the method of Example 19, wherein training the one or more machine learning models comprises uses overlapping data sets having pre-defined window lengths of previous executed test results.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific embodiments have been illustrated and described for purposes of illustration, it will be understood that various modifications may be made without departing from the spirit and scope of the disclosure. Accordingly, the invention should not be limited except as by the appended claims.

We claim:

1. A test and measurement device, comprising:
an interface;
one or more connectors, each connector to allow the test and measurement device to connect to a test and measurement instrument; and
one or more processors, the one or more processors configured to execute code to cause the one or more processors to:
receive one or more user inputs through the interface identifying one or more tests to perform on a device under test (DUT), the one or more user inputs including an intensity level;
form a connection through one of the one or more connectors to the DUT to perform the one or more tests and receive test result data;
apply one or more machine learning models to the test result data to identify potentially anomalous test results, anomalous test results meaning one or more data points in the test result data are possible outliers compared to other points in the test result data depending upon the intensity level; and
generate and present a representation of the test result data and the potentially anomalous test results.

2. The test and measurement device as claimed in claim 1, further comprising one or more repositories to store information related to at least one of the test result data, machine learning model configurations, metadata, and system logs.

3. The test and measurement device as claimed in claim 1, wherein the one or more processors reside on a computing device separate from the test and measurement device.

4. The test and measurement device as claimed in claim 3, wherein the test and measurement device and the computing device are a same device.

5. The test and measurement device as claimed in claim 1, wherein the connectors comprise instrument drivers for one or more test and measurement instruments.

6. The test and measurement device as claimed in claim 1, wherein the code that causes the one or more processors to apply one or more machine learning models comprises code that causes the one or more processors to:

generate a N-dimensional vector of the test result data for every test performed, where N is a number of measurements in the test results; and assign a score to each data point in the test result data, the score based upon a likelihood that the data point is an outlier.

7. The test and measurement device as claimed in claim 1, wherein the one or more processors are further configured to execute code that causes the one or more processors to train the one or more machine learning models.

8. The test and measurement device as claimed in claim 7, wherein the code that causes the one or more processors to train the one or more machine learning models uses multiple windows of a pre-defined window length of previous executed test results.

9. The test and measurement device as claimed in claim 7, wherein the code that causes the one or more processors to train the one or more machine learning models causes the one or more processors to pre-train the one or more machine learning models before deployment and to perform training during deployment.

10. A method of analyzing test data, comprising:

receiving one or more user inputs through an interface identifying one or more tests to perform on a device under test (DUT), the one or more user inputs including an intensity level;

forming a connection to at least one test and measurement instrument;

directing the test and measurement instrument to perform one or more tests on the DUT and receive test result data;

applying one or more machine learning models to the test result data to identify potentially anomalous test results, anomalous test results meaning one or more data points in the test result data are possible outliers compared to other data points in the test result data depending upon the intensity level; and generating and presenting a representation of the test result data and the potentially anomalous test results.

11. The method as claimed in claim 10, further comprising storing information related to at least one of the test result data, machine learning model configurations, metadata, and system logs.

12. The method as claimed in claim 10, wherein forming a connection to at least one test and measurement instrument comprises connecting to an external test and measurement instrument using a driver for the external test and measurement instrument.

13. The method as claimed in claim 10, wherein generating and presenting a representation comprises one of presenting a graph on a user interface, or presenting a data readout showing anomalous test results.

14. The method as claimed in claim 10, wherein applying one or more machine learning models comprises:

generating a N-dimensional vector of the test result data for every test performed; and assigning a score to each data point in the test result data.

15. The method as claimed in claim 10, further comprising training the one or more machine learning models using pre-trained data sets prior to model deployment, and data sets developed during deployment of the one or more machine learning models.

16. The method as claimed in claim 15, wherein training the one or more machine learning models comprises using overlapping data sets having pre-defined window lengths of previous executed test results.

* * * * *